United States Patent [19]

Aoyama et al.

[11] 4,449,066

[45] May 15, 1984

[54] BUFFER CIRCUIT FOR GENERATING OUTPUT SIGNALS HAVING SHORT RECOVERY TIME

[75] Inventors: Keizo Aoyama, Yamato; Takahiko Yamauchi, Kawasaki, both of Japan

[73] Assignee: Fujitsu Limited, Kawasaki, Japan

[21] Appl. No.: 331,287

[22] Filed: Dec. 16, 1981

[30] Foreign Application Priority Data

Dec. 24, 1980 [JP] Japan .................. 55-183076

[51] Int. Cl.³ ............... H03K 19/017; H03K 19/094; H03K 17/10
[52] U.S. Cl. ................... 307/482; 307/443; 307/575; 307/578
[58] Field of Search ............. 307/443, 449, 453, 546, 307/480–482, 554, 555, 246, 575, 577, 578, 582–584, 264, 270

[56] References Cited

U.S. PATENT DOCUMENTS

| | | | |
|---|---|---|---|
| 3,906,254 | 9/1975 | Lane et al. | 307/264 X |
| 4,080,539 | 3/1978 | Stewart | 307/270 X |
| 4,219,743 | 8/1980 | Millns et al. | 307/578 X |
| 4,307,308 | 12/1981 | Sano | 307/499 X |

*Primary Examiner*—Larry N. Anagnos
*Assistant Examiner*—David R. Hudspeth
*Attorney, Agent, or Firm*—Staas & Halsey

[57] ABSTRACT

In a buffer circuit comprising a first, a second and a third transistor and a capacitor for bootstrap action, an inverter is connected to the output point at which the second and third transistors are connected in series, the inverter inverting the potential of the output point and supplying the inverted potential to the gate of the first transistor, thereby ensuring the quick rise of the leading edge of the output signal.

12 Claims, 11 Drawing Figures

BUFFER CIRCUIT FOR GENERATING OUTPUT SIGNALS HAVING SHORT RECOVERY TIME

BACKGROUND OF THE INVENTION

1. Field of the Invention

The present invention relates to a buffer circuit. The buffer circuit of the present invention is used as, for example, an inverter circuit which employs FETs.

In general, in order to reduce the power dissipation in a static memory circuit, the standby mode method is adopted in which zero or only a minimum current flows in portions of the static memory circuit in the standby mode. However, in prior art buffer circuits used in static memory circuits, it is difficult to realize such zero or only a minimum current state since a certain amount of current flows in the buffer circuit which receives a chip-select signal. Examples of such prior art buffer circuits are illustrated in FIGS. 1A through 1D.

2. Description of the Prior Art

The prior art buffer circuit of FIG. 1A comprises a depletion type FET 32 and an enhancement type FET 33. The input signal $S_{in}$, such as a chip-selected signal, is supplied to the gate 1 of FET 33 and the output signal $S_{out}$ is produced at the point 6 at which the source and the gate of FET 32 and the drain of FET 33 are connected.

In the buffer circuit of FIG. 1A, when the input signal $S_{in}$ is at a high potential, FET 33 is in the ON state, and hence the output signal $S_{out}$ reaches a low potential. In this state, FET 32 continues to transmit the current, and hence the level of the low potential of the output signal $S_{out}$ does not decrease to $V_{ss}$. Under this condition, if the input signal $S_{in}$ changes to a low potential, FET 33 turns OFF, and hence the output signal $S_{out}$ reaches a high potential. Thus, the memory chip related to this buffer circuit is selected to become active. As described above, in the standby mode in which the input signal $S_{in}$ is at a high potential although the output signal $S_{out}$ is at a low potential, the current flows through $V_{cc}$, FET 32, FET 33 and $V_{ss}$ with the result that power down, i.e. the reduction of power dissipated, in the standby mode is not achieved.

The prior art buffer circuit of FIG. 1B comprises enhancement type FETs 32 and 33, a capacitor 4 for bootstrap action and a diode connection FET 36.

In the buffer circuit of FIG. 1B, when the input signal $S_{in}$ is at a high potential, FET 33 is in the ON state, and hence the output signal $S_{out}$ reaches a low potential. In this state, FET 32 is supplied with a gate potential through FET 36 from the source $V_{cc}$ and hence does not attain the complete OFF state and, accordingly, the reduction of the level of the low potential of the output signal $S_{out}$ is limited.

Under this condition, if the input signal $S_{in}$ changes to a low potential, FET 33 turns OFF, and hence the output signal $S_{out}$ reaches a high potential. In this operation, high potential is supplied to the gate of FET 32 due to the bootstrap effect of the capacitor 4, and hence FET 32 reaches the complete ON state and, accordingly, the level of the high potential of the output signal $S_{out}$ attains $V_{cc}$. As described above, in the standby mode in which the input signal $S_{in}$ is at a high potential although the output signal $S_{out}$ is in the low state, the current flows through $V_{cc}$, FET 32, FET 33 and $V_{ss}$ with the result that power down, i.e. the reduction of power dissipation, in the standby mode is not achieved.

The prior art buffer circuit of FIG. 1C comprises an enhancement type FET 33, the gate of which receives an input signal $S_{in}$, and another enhancement type FET 32, the gate of which receives the inverted signal $\overline{S_{in}}$ of the signal $S_{in}$. In the buffer circuit of FIG. 1C, although the current in the standby mode is made zero, the potential of the output signal $S_{out}$ is reduced by the amount of $V_{th}$, which is the threshold voltage of FET 32, with the result that the desired level of the high potential of the output signal $S_{out}$ cannot be attained.

The prior art buffer circuit of FIG. 1D comprises FETs 31, 32 and 33, a capacitor 4 and an inverter 51. The input signal $S_{in}$ is supplied to the source of FET 31 and the input terminal of the inverter 51. The gate of FET 32 is connected to the drain of FET 31 and one electrode of the capacitor 4 while the gate of FET 33 is connected to the output terminal of the inverter 51. In the circuit of FIG. 1D, when the buffer circuit is in the standby mode in which the input signal $S_{in}$ is at a low potential, FET 32 is in completely in the OFF state, FET 33 is in the ON state, and no current flows through $V_{cc}$, FET 32, FET 33 and $V_{ss}$, and hence the potential of the low output signal $S_{out}$ becomes equal to $V_{ss}$. The operation is described as follows. When the potential of the input signal $S_{in}$ is low, the output signal $S_{51}$ of the inverter 51 is at a high potential, and hence FET 33 is in the ON state, FET 32 is in the OFF state, the potential of the output signal $S_{out}$ is at a low level, and accordingly, no current flows through $V_{cc}$, FET 32, FET 33 and $V_{ss}$. When the potential of the input signal $S_{in}$ is high, the output signal $S_{51}$ of the inverter 51 is at a low potential, and hence FET 33 is in the OFF state, FET 32 is in the ON state, the potential of the output signal $S_{out}$ becomes equal to $V_{cc}$ (FIG. 2, (4)) because FET 32 is in the completely ON state due to the bootstrap effect of the capacitor 4. Due to the bootstrap effect, the level of the potential "$V_{cc}-V_{th31}$" is increased to the higher level of the potential "$V_{cc}+\alpha$" (FIG. 2, (2)), where $V_{th31}$ is the threshold voltage of FET 31 and $\alpha$ is the difference between the gate voltage $V_{g32}$ of FET 32 and $V_{cc}$.

However, in the buffer circuit of FIG. 1D, there is a disadvantage in that the recovering rise of the potential $S_{out}$ is slow in the case where a short duration pulse P occurs in the input signal $S_{in}$ at the time t3 and hence the potential $S_{31}$ of the gate of FET 32 is lowered, as is illustrated in FIG. 3, which illustrates the operation of the buffer circuit of FIG. 1D. In FIG. 3, (3) and (4), the high level (H.L.) of $S_{51}$ and the low level (L.L.) of $S_{out}$ are indicated by the broken lines.

Such a short duration pulse P may occur in the following cases. For example, in the case where either the fall of the trailing edge of a first input signal of a two-input NAND gate circuit is too late or the rise of the leading edge of a second input signal of the two-input NAND gate circuit is too early. Also, for example, in the case where, as is usual in static memory circuits, the width of the signal pulse is not a predetermined amount in order to achieve simplification of the structure and the operation of the device.

As is illustrated in FIG. 3, when a short duration pulse P occurs in the input signal $S_{in}$, the charges on the gate of FET 32 are discharged through FET 31 during the falling portion of the pulse P. In the recovering rise portion of the pulse P, the potential $S_{51}$ does not reach the complete high level (FIG. 3, (3)), and hence FET 33 is in either the OFF state or the incomplete ON state, and accordingly, the capacitor 4 is not sufficiently charged. Thus, the bootstrap operation of the capacitor 4 is not satisfactorily carried out and hence the recovering rise portion of the output signal $S_{out}$ is slow. Also, the potential of the high output signal $S_{out}$ cannot attain $V_{cc}$. Accordingly, the operation of the buffer circuit of FIG. 1D has these disadvantages. Such disadvantages are aggravated in the case where the logical operation of the subsequent circuit receiving the output signal $S_{out}$ of the buffer circuit is correctly achieved only when the rise of the leading edge of the output signal $S_{out}$ is quick. In this case, if the rise of the leading edge of the output signal $S_{out}$ is slow, the subsequent circuit receiving the output signal $S_{out}$ of the buffer circuit may operate erroneously with the result that correct operation of the static memory circuit using the buffer circuit may not be ensured.

The prior art circuit of FIG. 1D is described in, for example, U.S. Pat. No. 3,774,055.

SUMMARY OF THE INVENTION

It is an object of the present invention to provide an improved buffer circuit in which the quick rise of the leading edge of the output signal is ensured, and accordingly, the subsequent logic circuit is prevented from operating erroneously.

In accordance with the present invention, there is provided a buffer circuit comprising a first transistor, the source or the drain of which receives an input signal, a second transistor, the gate of which is connected to the drain or the source of the first transistor, the second transistor being adapted to carry out the bootstrap function, a third transistor which is connected in series with the second transistor, a signal which has the reverse phase of the phase of the input signal and is slightly delayed from the input signal being supplied to the gate of the third transistor, and an inverter connected to the output point at which the second and the third transistors are connected in series, the inverter inverting the potential of the output point and supplying the inverted potential to the gate of the first transistor.

These together with other objects and advantages which will become subsequently apparent reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 4:
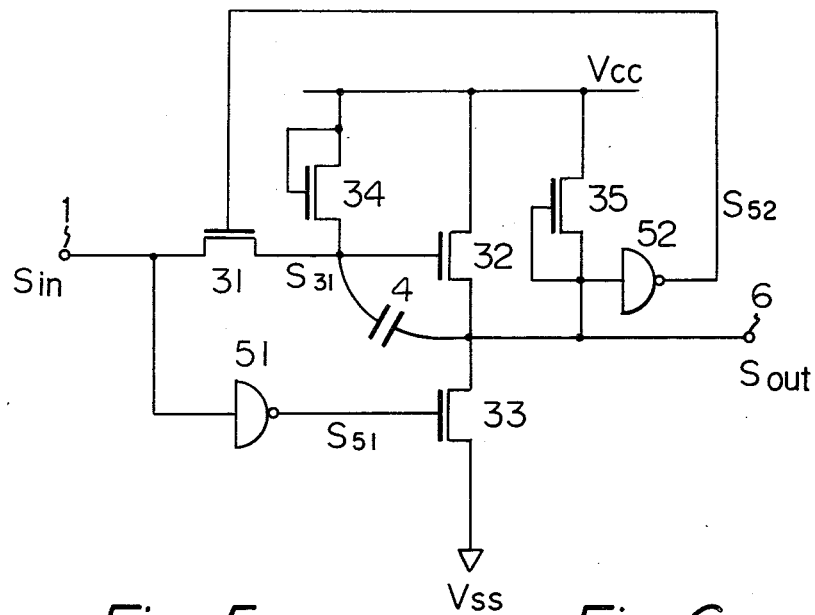
FIG. 4 illustrates a buffer circuit in accordance with an embodiment of the present invention.

A buffer circuit in accordance with an embodiment of the present invention is illustrated in FIG. 4. The circuit of FIG. 4 comprises an input terminal 1, a first FET 31, a second FET 32, a third FET 33, a fourth FET 34, a fifth FET 35, a capacitor 4 for bootstrap effect, a first inverter 51, a second inverter 52, and an output terminal 6.

FET 31, FET 32 and FET 33 are FETs of the enhancement type. When high potential is applied to the gate of FET 33, FET 33 turns ON and hence low potential is produced at the output terminal 6. When low potential is applied to the gate of FET 33, FET 33 turns OFF and hence high potential is produced at the output terminal. At that moment, a high potential is applied to the gate of FET 32 due to the bootstrap effect of the capacitor 4 and FET 32 attains the completely conductive state. Thus high potential of the output signal $S_{out}$ at the output terminal 6 can attain the potential $V_{cc}$.

To the gate of the third FET 33 a signal $S_{51}$, which has the reverse phase of the phase of the input signal $S_{in}$ and is slightly delayed from the input signal $S_{in}$, is supplied.

Figure 6:
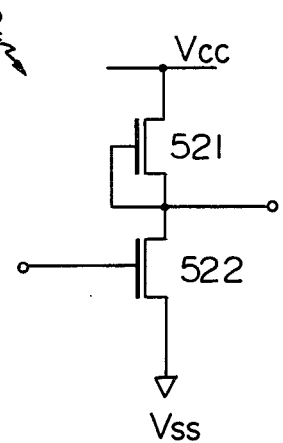

The output signal $S_{out}$ is applied to the input terminal of the second inverter 52. The output signal $S_{52}$ is the inverted signal of the signal $S_{out}$. The signal $S_{52}$ is applied to the gate of the first FET 31. The fourth FET 34 is connected between the power source $V_{cc}$ and the gate circuit of the second FET 32. The fourth FET 34 operates to precharge the gate circuit of the second FET 32 when the power supply to the buffer circuit of FIG. 6 is switched on. The fifth FET 35 operates to supply charges to the output terminal 6 in order to prevent the potential of the output terminal 6 from being reduced due to a junction leakage.

Figure 7:
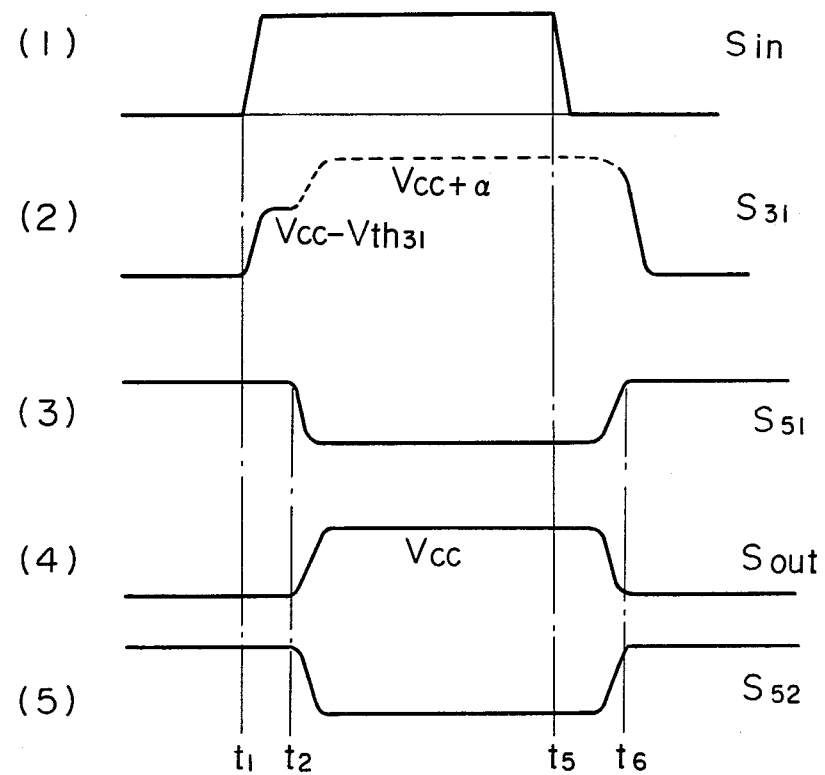
Figure 8:
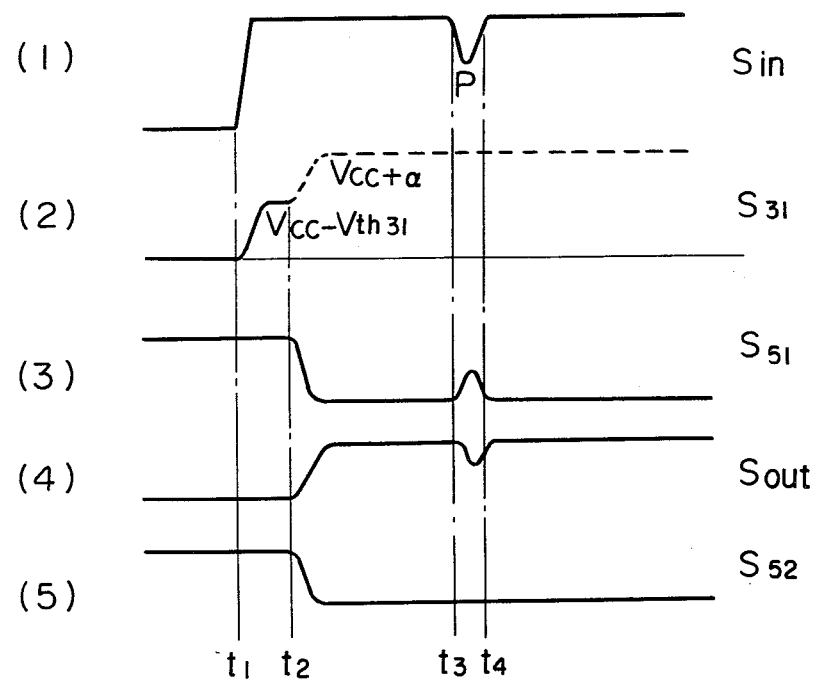

The operation of the buffer circuit of FIG. 4 is illustrated in FIGS. 7 and 8. The normal operation of the buffer circuit of FIG. 4 is illustrated in FIG. 7.

The operation of the buffer circuit of FIG. 4 in the case where a short duration pulse P occurs in the input signal $S_{in}$ is illustrated in FIG. 8. As is illustrated in FIG. 8, even when a short duration pulse P occurs in the input signal $S_{in}$ at the time t3 (FIG. 8, (1)), the charge at the gate circuit of the second FET 32 is not discharged and the potential of the gate circuit of the second FET 32 is maintained at a constant potential (FIG. 8, (2)), because the first transistor FET 31 is in the OFF state due to the low $S_{52}$ signal applied to the gate of the first FET 31.

Figure 1A:
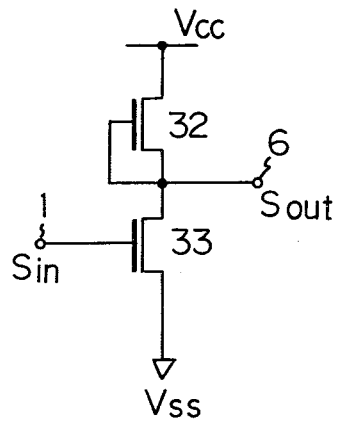
FIGS. 1A, 1B, 1C and 1D illustrate prior art buffer circuits.
Figure 1B:
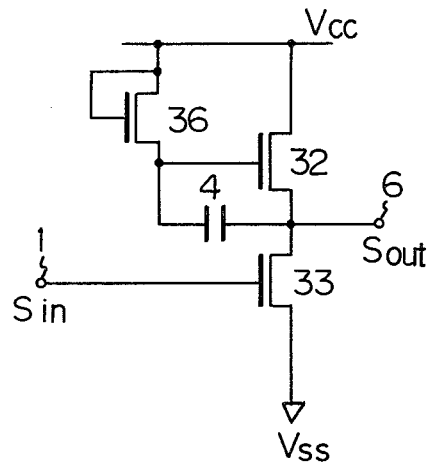
Figure 1C:
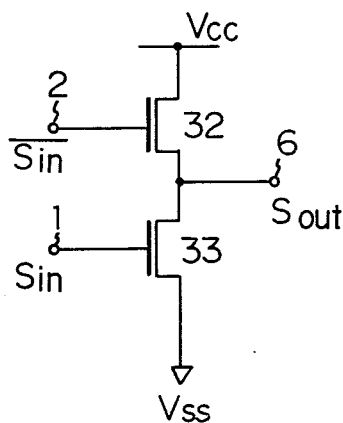
Figure 1D:
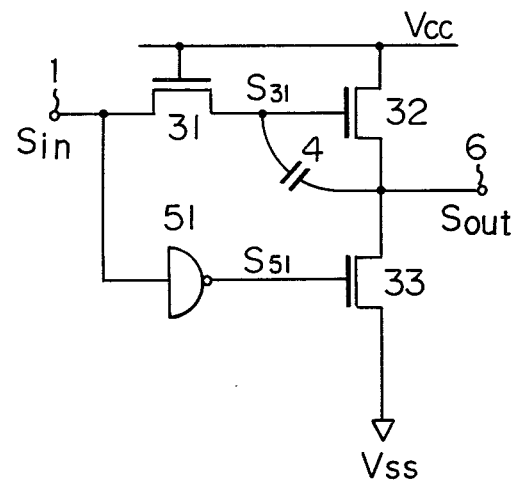
Figure 2:
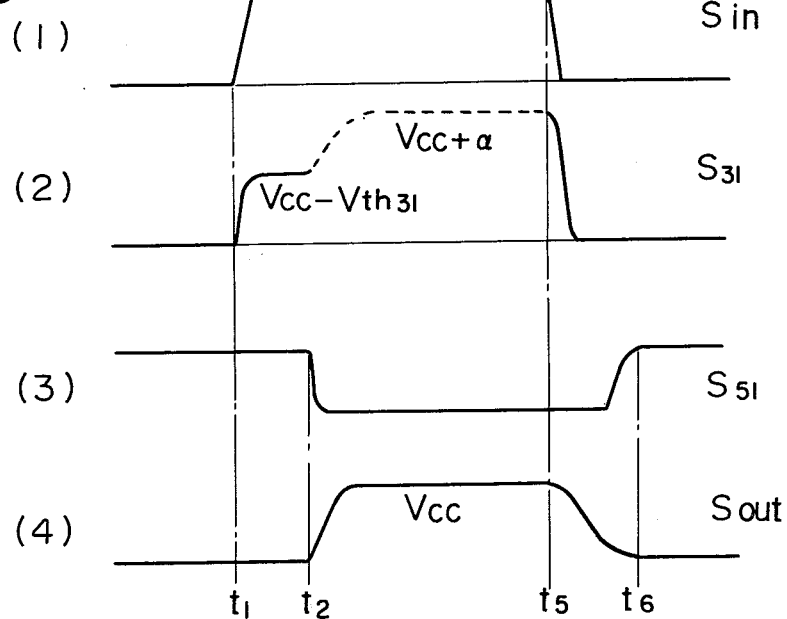
FIGS. 2 and 3 illustrate the operation characteristics of the buffer circuit of FIG. 1D.
Figure 3:
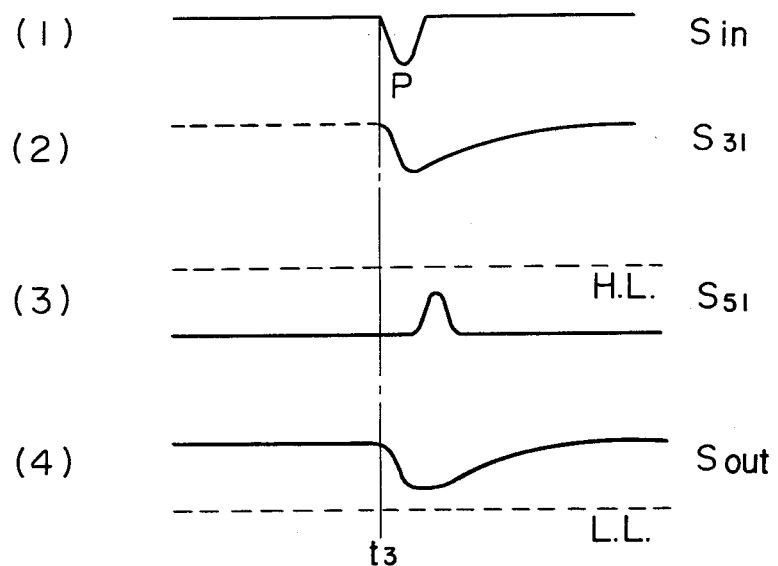

Accordingly, the potential $S_{51}$ varies from low level to high level and again to low level for a short period (FIG. 8, (3)). When the potential $S_{51}$ again reaches a low level at the time t4 (FIG. 8, (3)), the FET 33 turns OFF and the potential $S_{out}$ rises immediately to the potential $V_{cc}$ due to the normal bootstrap effect (FIG. 8, (4)). Thus the short pulse P which occurs in the input signal $S_{in}$ does not exert a substantial influence on the waveform of the output signal $S_{out}$ (FIG. 8, (4)). Also, it should be noted that, similar to the case of FIG. 1D, there occurs hardly any power dissipation in the standby mode in the circuit of FIG. 4 in the case where a chip-select signal is used as an input signal.

Figure 5:
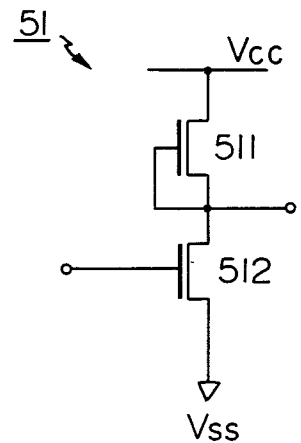
FIGS. 5 and 6 illustrate the structures of the inverters in the buffer circuit of FIG. 4, and FIGS. 7 and 8 illustrate the operation characteristics of the buffer circuit of FIG. 4.

An example of the structure of the inverter 51 in the circuit of FIG. 4 is illustrated in FIG. 5. The inverter 51 comprises FET 511 and 512 connected in series. The input signal is supplied to the gate of FET 512. The output signal is produced at the terminal where the source and the gate of FET 511 and the drain of FET 512 are connected.

An example of the structure of the inverter 52 in the circuit of FIG. 4 is illustrated in FIG. 6. The inverter 52 comprises FET 521 and 522 connected in series. The input signal is supplied to the gate of FET 522. The output signal is produced at the terminal where the source and the gate of FET 521 and the drain of FET 522 are connected.

Athough a preferred embodiment has been described hereinbefore with regard to the drawings, it can be understood that various modified embodiments of the present invention are possible. For example, although in the circuit of FIG. 4 the second input signal $S_{51}$ is the signal which is obtained by means of an inversion action on the first input signal $S_{in}$ of the inverter 51 and has a delay with respect to the input signal $S_{in}$, it is also possible to provide a first input signal $S_{in}$ and a second input signal $S_{51}$ which independently have the same relationship to the first input signal $S_{in}$ as in the circuit of FIG. 4.

Also, although the above-mentioned embodiments are described with regard to a chip selection type buffer circuit, the present invention is also applicable to general buffer circuits such as an address inverter.

Also, although FET 34 and FET 35 are provided in the circuit of FIG. 4, it is possible to constitute embodiments of the present invention without FET 34 and FET 35.

We claim:

1. A buffer circuit operatively connectable to a voltage source and operatively connected to receive an input signal, comprising:
   a capacitor;
   a first FET transistor having one of a source or drain which receives the input signal;
   a second FET transistor for performing a bootstrap function, having a source operatively connected to one terminal of said capacitor, having a gate operatively connected to the other of the drain or source of said first FET transistor, and the other terminal of said capacitor and having a drain operatively connected to the voltage source;
   a third FET transistor having a source or drain operatively connected in series with the source of said second FET transistor at an output point, and having a gate for receiving a signal which has an inverse phase of the phase of the input signal and which is slightly delayed from the input signal, and having the other of the source or drain connected to a reference voltage; and
   an inverter operatively connected to the output point at which said second and third FET transistors are connected in series, said inverter inverting the potential at the output point and supplying the inverted potential to the gate of said first FET transistor.

2. A buffer circuit as defined in claim 1, wherein a fourth transistor is connected between the gate of said second FET transistor and the voltage source for precharging the gate of said second FET transistor.

3. A buffer circuit as defined in claim 1 or 2, wherein a fifth transistor is connected between said output point and the voltage source for supplying charges to said output point to prevent the potential of said output point from being reduced due to a junction leakage.

4. A buffer circuit comprising:
   a first transistor for receiving a first input signal;
   a second transistor for receiving an output from said first transistor;
   means connected with said second transistor for effecting a bootstrap function;
   a third transistor connected in series with said second transistor and providing an output signal point at the connection therebetween;
   means for providing a second input signal to said third transistor which is slightly delayed from and of inverse phase to said first input signal; and
   further means connected between the output signal point and the first transistor for providing an inverted output signal to said first transistor for effecting a quick rise of a leading edge of the output signal.

5. A buffer circuit as set forth in claim 4, wherein said further means includes an inverter connected between said output signal point and an input to said first transistor.

6. A buffer circuit as set forth in claim 5, wherein said means for providing a second input signal includes another inverter connected between the input to said first transistor and the third transistor.

7. A buffer circuit as set forth in claim 4, 5 or 6, wherein all said transistors are FETs of the enhancement type.

8. A buffer circuit as set forth in claim 5, wherein said inverter comprises two FET transistors connected in series.

9. A buffer circuit as set forth in claim 8, wherein a second inverter having FET transistors in series is connected between the input to said first transistor and the third transistor.

10. A buffer circuit as set forth in claim 7, wherein said first FET transistor has either the source or the drain receiving the input signal, said second FET transistor has its gate connected to the other of the drain or source of said first FET transistor, and said means connected with said second FET transistor to effect a bootstrap function comprises a capacitor connected between the gate and source of said second FET transistor.

11. A buffer circuit as set forth in claim 10, wherein a fourth transistor is connected between the gate of said second FET transistor and the voltage source for precharging the gate of said second FET transistor.

12. A buffer circuit as defined in claim 11, wherein a fifth transistor is connected between said output signal point and the voltage source for supplying charges to said output signal point to prevent the potential of said output signal point from being reduced due to transistor junction leakage.

* * * * *